United States Patent [19]
Cerrina et al.

[11] Patent Number: 6,002,740
[45] Date of Patent: Dec. 14, 1999

[54] METHOD AND APPARATUS FOR X-RAY AND EXTREME ULTRAVIOLET INSPECTION OF LITHOGRAPHY MASKS AND OTHER OBJECTS

[75] Inventors: Franco Cerrina, Madison, Wis.; Thomas B. Lucatorto, Washington, D.C.

[73] Assignee: Wisconsin Alumni Research Foundation, Madison, Wis.

[21] Appl. No.: 08/942,757

[22] Filed: Oct. 2, 1997

Related U.S. Application Data

[60] Provisional application No. 60/027,808, Oct. 4, 1996.

[51] Int. Cl.⁶ .................................................. G01B 15/06
[52] U.S. Cl. .............................. 378/43; 378/35; 378/58
[58] Field of Search .............................. 378/43, 34, 35, 378/58, 62; 250/306, 423 P; 382/144, 149

[56] References Cited

U.S. PATENT DOCUMENTS 5,045,696  9/1991  Hirose ................................... 378/43 X

FOREIGN PATENT DOCUMENTS 1134-300  5/1989  Japan ........................................ 378/43

OTHER PUBLICATIONS

Photo Emission Electron Microscope (PEEM) from Staib Instruments, Inc., publication date unknown, but prior to Nov. 1995.

Primary Examiner—David P. Porta
Attorney, Agent, or Firm—Foley & Lardner

[57] ABSTRACT

Inspection of objects such as X-ray lithography masks is carried out by passing X-rays or extreme ultraviolet light through an object which absorbs in a pattern to provide a patterned X-ray or ultraviolet image which is then directed to a converter. The converter converts the image incident upon it to an image formed by electrons emitted from the converter. The emitted electrons are magnified in an electron microscope and the magnified electron image is displayed by the electron microscope. The visible image may be further digitized and processed by a computer, including long-term storage or display on a computer monitor. X-ray lithography masks may be inspected by passing X-rays through masks of the same type that will be used for lithography so that the magnified image of the X-rays passed through the masks corresponds to the pattern of X-rays that will be incident on a photoresist, allowing accurate inspection of X-ray masks before use.

17 Claims, 2 Drawing Sheets

METHOD AND APPARATUS FOR X-RAY AND EXTREME ULTRAVIOLET INSPECTION OF LITHOGRAPHY MASKS AND OTHER OBJECTS

This application claims the benefit of U.S. Provisional Patent Application No. 60/027,808, filed Oct. 4, 1996.

This invention was made with United States government support awarded by the following agencies: ONR, Grant No: N00014-91-J-1876 and NSF, Grant No: ECS-9317745. The United States has certain rights in this invention.

FIELD OF THE INVENTION

This invention pertains generally to X-ray and extreme ultraviolet (EUV) lithography, particularly to masks used in X-ray and EUV lithography and methods and devices for inspecting the mask pattern, and to X-ray and EUV inspection of objects in general.

BACKGROUND OF THE INVENTION

X-ray lithography is of growing importance in the fabrication of microelectronic devices and micromechanical structures. The basic process of producing a microelectronic device involves the modification of the surface material of a semiconductor substrate, such as of silicon, in a pattern. The interplay of the material changes and the pattern defines the electrical characteristics of the microelectronic device. By reducing the dimensions of the pattern, the number of electronic devices on a single silicon chip can be increased proportionally. The shorter wavelengths of X-rays permit smaller features to be produced using X-ray lithography than is generally possible using conventional lithography with visible light. A similar process can be used to form micromechanical devices, by, for example, electroplating metal structures in a desired pattern onto a substrate. X-ray lithography is used to define the pattern on the substrate which will be doped, etched, or otherwise modified to form the microelectrical or micromechanical device.

In the basic X-ray lithography microelectronic or micromechanical device manufacturing process, a photosensitive material, such as polymethylmethacrylate (PMMA), is deposited on the substrate surface. The photoresist is X-ray sensitive and, depending on the photoresist used, portions of the photoresist that are exposed to X-rays may be removed (or left remaining) by a developing process. The microelectronic or micromechanical device is formed by etching or otherwise modifying the substrate in the areas from which the photoresist has been removed. To form a desired pattern in the photoresist, the X-rays that are used to expose the photoresist are passed through an X-ray mask that includes the pattern that is transferred to the photoresist. An exemplary portion of an X-ray mask 10 is schematically illustrated in FIG. 1. The mask 10 is typically composed of a structural material or carrier 11, such as of silicon nitride or silicon carbide, through which X-rays are transmitted, and X-ray absorbers 12, made of, e.g., gold or tungsten, which are formed on the mask 10 in the desired pattern to a thickness of, e.g., approximately 0.2–0.5 $\mu$m. Much more important than the specific choice of mask materials is that the ratio of the transmission of X-rays through "clear" areas 11 and "opaque" areas 12 of the mask 10 does not fall below a specified value, R, typically 3–10. Any local change in this transmission ratio constitutes a defect in the mask pattern. For example, as illustrated in FIG. 2, a portion 13 of the X-ray absorber pattern 12 with a transmission ratio that falls below the value R constitutes a "clear" defect, allowing the transmission of X-rays where they should be blocked. As illustrated in FIG. 3, a portion 14 of the carrier material 11 with a transmission ratio of R or more constitutes a "dark" defect when positioned on the mask so as to block X-rays where they should be freely transmitted.

In X-ray lithography there is no reduction in the size of the mask pattern as it is transferred to the photoresist. Thus, any imperfections or defects in the mask will be faithfully recorded into the photoresist. This can cause errors and loss of functionality in the microelectronic circuit or micromechanical device being defined by the mask pattern. It is thus of critical importance to verify that the mask pattern is as fully specified by the designer, and does not contain any defects. Accurate inspection information on the mask pattern is needed.

Typically, inspection of the X-ray mask pattern is accomplished using electron beam inspection systems, such as dedicated scanning electron microscopes (SEMs). Such devices are used because of the high resolution required to properly verify the X-ray mask pattern. It is typically necessary to have a resolution of about ⅒th of the critical dimension of the pattern under inspection. Thus, for a critical dimension of 0.25 microns (corresponding to a 256 megabit DRAM) a resolution of 25 nm is required. For 1 gigabit DRAMS having a critical dimension of 0.15 microns, a resolution of 15 nm is required. The use of scanning electron microscopy (SEM) to perform the X-ray mask inspection has several important disadvantages, however. First, the substrate structure or membrane of the X-ray mask is often made of an insulating material, such as silicon nitride. Thus, a conducting layer must be deposited on the structural membrane in order to prevent charging in the SEM. This deposition not only requires an extra processing step, but could also introduce spurious defects and degrade the performance of the mask, and is preferably avoided. Secondly, the electron signal recorded from a structure may differ significantly from its X-ray transmission characteristics. This is because the electrons used in SEM only probe the near surface regions of the mask, and thus cannot be used to detect all defects. Thus, the SEM image of the mask will not necessarily represent the image of the X-ray mask pattern that would be produced by X-rays. Therefore, there is not a one-to-one mapping of defects detected using the SEM and true defects that would result from using the X-ray mask in X-ray lithography processing. Finally, the X-ray mask structure diffracts X-rays that pass through it. This causes intensity variations, and thereby line width variations, which could result in defects that cannot be observed by an SEM.

The best type of X-ray mask inspection system would be one based on the direct measurement of X-rays transmitted by the X-ray mask. Such an approach is used in optical lithography, where an optical microscope is used to measure the light transmitted by an optical mask. An analogous X-ray measurement cannot be performed, however, because of the lack of an equivalent X-ray microscope; there are no suitable or convenient magnifying optics for X-rays having wavelengths on the order of those employed in X-ray lithography (energies above 100 eV).

Extreme ultraviolet (EUV) radiation, i.e., radiation having wavelengths in the range from 5 nm to 30 nm, can also be used in the lithographic fabrication of microelectronic and micromechanical devices. In its present realization, EUV lithography utilizes a stepper (or projector) consisting of two or more EUV multilayer reflectors and an EUV multilayer reflective mask. As with X-ray mask lithography, accurate inspection of the EUV mask pattern is required to ensure that defects in the mask are not transferred to the photoresist, and, ultimately, to the final microelectronic or micromechanical product. In addition, the quality of the image projected by the stepper must be evaluated to ensure that proper alignment of all optical elements has been achieved.

SUMMARY OF THE INVENTION

In accordance with the present invention, inspection of an X-ray lithography mask is accomplished using a conversion electron microscope, which allows inspection of an X-ray image transmitted by the mask. The conversion electron microscope includes a photo-emitting cathode and a magnifying electron microscope. The photo-emitting cathode, when illuminated by X-rays, emits electrons whose intensity is directly proportional to the local intensity of the X-rays impinging on the cathode. Thus, the photo-emitting cathode acts as a converter which converts X-rays to electrons. The converter is preferably made of a thin film of converter material that is deposited on a thin silicon nitride membrane to form the photo-emitting cathode. The electron microscope includes a set of electron optics which highly magnify the electron image produced by the photo-emitting cathode to form an image of the X-ray pattern impinging on the converter.

Inspection of an X-ray lithography mask in accordance with the present invention is performed by passing X-rays through the X-ray mask in the identical manner as when the X-ray mask is used during microelectronic or micromechanical device production. The converter film is placed in the same position with respect to the X-ray mask as the photoresist layer would be placed during production. The actual X-ray image formed by the mask is thus converted to electrons by the converter. The emitted electrons are magnified by the electron microscope, and the resulting electron pattern is displayed on a phosphor screen viewing port of the electron microscope. This image, in turn, may be digitized and compared by a computer with the designed mask pattern or with a different portion of the same mask. In this manner, defects in the mask pattern may be discerned.

The method and apparatus of the present invention offers several advantages over previous methods and systems for inspecting X-ray lithography masks. In accordance with the present invention, an electron microscope measures directly the X-ray image (converted to electrons) transmitted by the mask. Thus, the microscope detects the same image as will be recorded by a photoresist when using the mask for production, without any further changes. The predicted pattern on the photoresist is free from the uncertainties of SEM measurement—where the image produced is representative of the interaction of high energy electrons with the features in the mask, and which requires a complex algorithm to convert the detected electron transmission and diffraction through the X-ray lithography mask into a predicted photoresist printed pattern. In the present invention, because X-rays are transmitted through the X-ray lithography mask to produce an image of the mask, the inspection system will be sensitive to any changes in the bulk of the X-ray mask material that will be manifested as variations in the final image intensity. Consequently, another advantage of the invention is the fact that it is capable of probing the absorption characteristics of the bulk structural material of the mask, as well as of the deposited features on the mask, rather than probing only the surface of the features, as is the case with conventional electron microscopes, scanning tip microscopes (e.g., atomic force microscopes (AFMs)), or near field optical microscopes.

The field of view of a mask inspection system in accordance with the present invention may be relatively large (e.g., 25×25 microns). Because of the high data throughput intrinsic to the parallel detection of a transmitted X-ray image in accordance with the present invention, an entire mask can be scanned relatively quickly. The inspection system of the present invention is also capable of zooming its magnification, making it possible to quickly inspect the mask for any departure from a designed pattern stored in a computerized database, and then to close in on and pinpoint the areas that exhibit anomalies for subsequent possible repair (or rejection of the mask). The present invention is also compatible with the standard procedure in the semiconductor industry for mask inspection and use. Mask inspection using the conversion microscope may be accomplished with the same source of X-rays that is used for production. No special type of source is required. The mask inspection system of the present invention is also directly compatible with the synchrotron sources of X-rays that may be used in advanced production facilities.

The inspection system of the present invention may also be used for the inspection of EUV steppers and EUV lithographic masks. For this application, the converter film of the inspection system is placed in the wafer plane of the EUV stepper. Alternatively, the converter film may be held in close proximity to the EUV mask to directly map the light intensity. Since the mask features are relatively large (i.e., 4 or 5 times the critical dimension), a faithful image can be obtained at a distance between the converter and the mask of around 0.5 $\mu$m. The converter converts the EUV rays to electrons that are magnified by the electron microscope to form an image which permits direct, real-time imaging of the EUV mask features. Defects will become apparent as errors in the image. As with the X-ray lithography masks, the detected EUV pattern may be digitized and compared to a specified design. In addition, the capability of the present invention to produce a direct, real-time visualization of the image formed by an EUV stepper will allow for critical alignment adjustments to be made on the optical elements of the stepper in order to ensure optimum performance.

The mask inspection system of the present invention may also be employed to inspect other types of objects in fields other than X-ray or EUV lithography or the production of microelectrical or micromechanical devices. For example, in place of an X-ray or EUV lithography mask, a sample of biological or other material may be inspected using the present invention. X-rays may be passed through the sample, with the rays impinging on the converter generating electrons that are magnified by an electron microscope, and ultimately displayed to a user. X-ray absorption characteristics of a sample can thereby be observed.

Further objects, features, and advantages of the invention will be apparent from the following detailed description when taken in conjunction with the accompanying drawings.

DETAILED DESCRIPTION OF THE INVENTION

Figure 1:
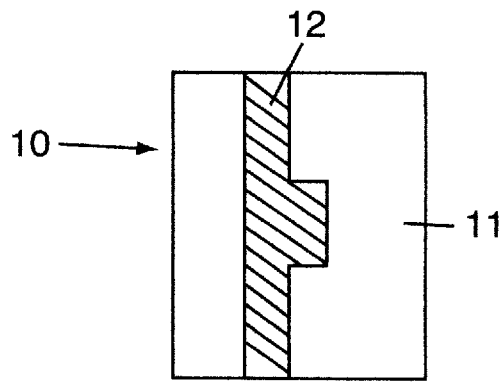
FIG. 1 is a schematic illustration of an exemplary portion of an X-ray mask.
Figure 2:
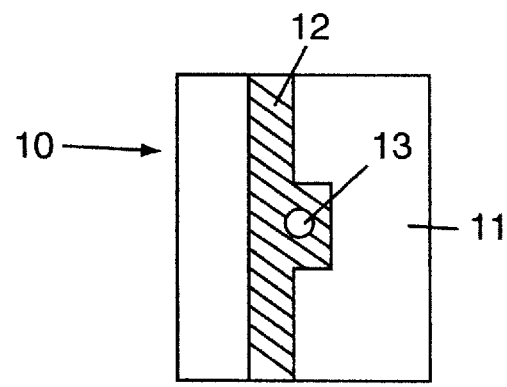
FIG. 2 is a schematic illustration of the exemplary X-ray mask portion of FIG. 1 with a "clear" defect thereon.
Figure 3:
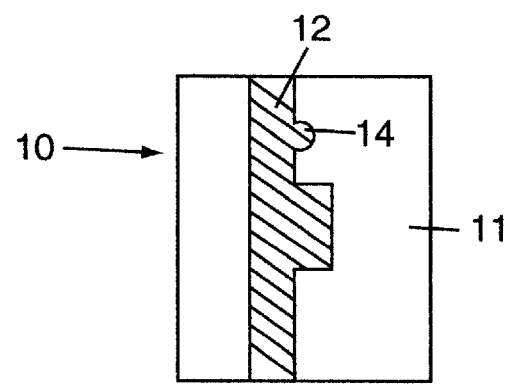
FIG. 3 is a schematic illustration of the exemplary X-ray mask portion of FIG. 1 with a "dark" defect thereon.
Figure 4:
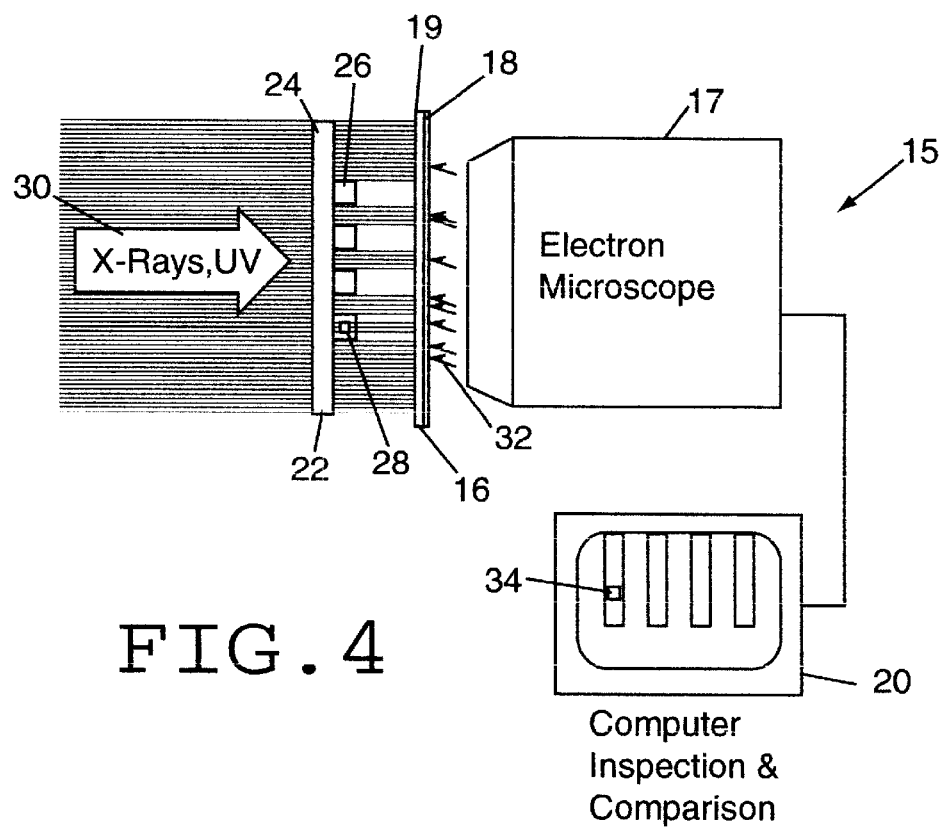
FIG. 4 is a schematic diagram of an apparatus for the inspection of X-ray and EUV lithography masks and other objects in accordance with the present invention.

A system in accordance with the present invention for the inspection of X-ray lithography masks is shown generally at 15 in FIG. 4. The inspection system 15 employs a conversion electron microscope to convert an X-ray image to an electron image that is then magnified and displayed. The conversion electron microscope includes a photo-emitting cathode 16 and an electron microscope 17. The electron microscope 17 may be of a known design, and is based on a set of electron optics that highly magnify an electron image formed by the photo-emitting cathode 16. The photo emitting cathode 16, when illuminated by X-rays, emits electrons whose intensity is directly proportional to the local intensity of X-rays impinging thereon. The photo-emitting cathode 16 includes a converter 18 that converts X-rays to electrons. The converter 18 may be made, for example, of phosphor or cesium iodide in the form of a thin film (100–200 A) that is deposited on a membrane 19 to form the photo-emitting cathode 16. The membrane 19 may preferably be formed as a layer of a material that permits relatively unimpeded passage of X-rays, e.g., approximately 0.1 $\mu$m thick silicon nitride. The photo-emitting cathode 16 is mounted so that the converter 18 is at the focal plane of the electron magnifying optics of the electron microscope 17. The inspection system 15 also preferably includes a computer inspection, comparison, and display system 20 that is connected to the electron microscope 17.

The use of the inspection system 15 to inspect an X-ray lithography mask 22 may also be described with reference to FIG. 4. The X-ray mask 22 includes a structural base or substrate layer 24 made of a material, e.g., silicon nitride, which allows X-rays to pass relatively unimpeded therethrough. Upon the structural layer 24, X-ray absorbers 26 are positioned in a designed pattern. In microelectronic or micromechanical device production, the X-ray mask 22 will be interposed between a source of X-rays and a photoresist layer so that the pattern of the absorbers 26 will be transferred onto the photoresist layer. The photoresist layer may then be developed, and electrical or micromechanical structures may be formed by material modification or metal deposition onto a substrate in the removed areas of the patterned photoresist. As described earlier, it is critical that any defects 28 in the absorber pattern 26 be detected. Defects 28 in the absorber pattern 26 will affect the ability of the absorber 26 to block X-rays, thereby altering the exposed photoresist pattern from the desired pattern.

To inspect an X-ray lithography mask 22 using the inspection system 15 of the present invention, the mask 22 is placed between a source of X-rays 30 and the photo-emitting cathode 16. Standard X-ray sources, including synchrotron sources, may be used. No special type of source is required. The distance between the converter layer 18 and the mask 22 can be adjusted by the user to match the distance between the mask and the photoresist when the mask is used in device production. This makes it possible to measure the actual image pattern formed by the X-ray mask as a function of this distance or gap. This capability also allows for an accurate evaluation of diffraction effects on the image. X-rays from the X-ray source 30 are transmitted through the mask 22, and the membrane 19, and impinge on the converter 18. Some of the X-rays, however, are absorbed by the features that define the pattern in the mask. Where the converter 18 is illuminated by X-rays, it emits electrons 32 whose intensity is directly proportional to the local intensity of the X-rays impinging thereon. Thus, the mask inspection system of the present invention allows for accurate measurement of the total dose of X-rays impinging at each point of the converter, and therefore at each point of the image to be formed by the mask 22. This is a critical element needed to ensure defect-free printing using the mask 22.

The electrons 32 emitted from the converter 18 are then magnified by a set of electron optics in the electron microscope 17. The electron microscope 17 forms an image of the mask pattern which may be fed to the computer system 20 for analysis and display. The electron microscope field of view is preferably a relatively large (25×25 microns) area. Because of the high data throughput intrinsic to the parallel detection of an image in accordance with the present invention, an entire mask can be scanned relatively quickly.

As shown in FIG. 4 for purposes of illustrating the invention, a defect 28 in an absorber 26 of the mask 22 may cause X-rays to pass through the mask in an unintended portion of the pattern. These X-rays will be converted to electrons 32 that will, in turn, be magnified by the electron microscope 17 to be displayed on the computer comparison and display system 20 as a displayed corresponding defect 34 in the designed mask absorber pattern. A defect 28 in the X-ray mask absorber 26 is thus discovered by detection of the corresponding displayed defect 34 in the image produced by the electron microscope 17 and computer display system 20. The defect 34 will be immediately apparent, for example, as a bright or dark spot on the pattern.

Figure 5:
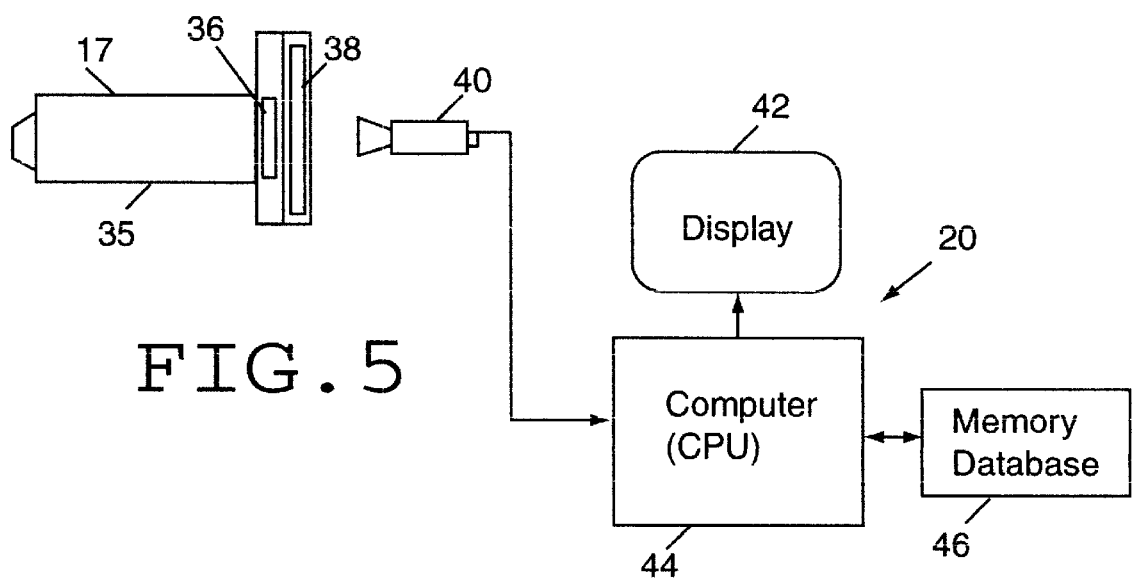
FIG. 5 is a more detailed schematic illustration of an electron microscope and computer comparison and display system for the inspection apparatus of FIG. 4.

The electron microscope 17 and computer comparison and display system 20 of the inspection system 15 are described in more detail with reference to the schematic illustration of FIG. 5. The electron microscope 17 is based on a set of electron optics which highly magnify the electron image formed by the photo-emitting cathode 16. The electron microscope 17 may, for example, be implemented using the Photoemission Electron Microscope (PEEM) available from Staib Instruments, Inc. of Newport News, Va. This commercially available PEEM provides electron microscopy at a spatial resolution of 200 nm with 100×–1000× magnification. In the electron microscope 17, the electrons 32 emitted from the converter 18 are accelerated by an electrostatic field of several kV/mm field strength between the converter 18 and the first electrode of the PEEM. An electrostatic imaging column 35, with several lenses (not shown), puts an enlarged photo-emission yield picture of the mask pattern onto a microchannel plate image intensifier 36. The electrons are then further accelerated onto a phosphorus screen 38 to convert the photo-emission yield distribution into a visible image. Other similar electron microscope systems 17 may also be used in accordance with the mask inspection system of the present invention.

The mask pattern image displayed on the phosphor screen 38 of the electron microscope 17 may be recorded and stored in video format using standard video techniques. For example, a charge coupled device (CCD) camera 40 may be used to convert the mask image into video image format. The video image produced by the camera 40 is preferably fed to the computer inspection and display system 20. There, the detected mask image may be displayed on a computer display 42, such as a computer monitor. The video image from the camera 40 may also be converted by the central processing unit (CPU) 44 of the computer system 20 to form a digitized image of the detected mask pattern. The digitized image may then be compared with a digitized image of the mask pattern as designed, which may be stored in a database in the computer's memory 46, using image comparison software programs. The results of the comparison between the detected and designed mask images may be displayed on the computer display 42, with any differences between the detected and designed images highlighted or otherwise indicated as defects in the X-ray mask. Having thereby initially detected an error or defect, the magnification of the electron microscope 17 may be zoomed in for closer observation of areas on the mask 22 which exhibit anomalies. In this way, the exact coordinates of defects can be recorded, and stored in the computer memory 46, for later transfer to a repair instrument (typically a focused ion beam). A high resolution X-Y stage (not shown) may be combined with the inspection system 15 to support the mask 22 and to facilitate determination of anomaly coordinates.

It is apparent that the method of inspecting an X-ray lithography mask of the present invention that has just been described is performed under the same operating conditions as will be employed during actual exposure of a photoresist using the X-ray mask. Thus, errors introduced by inspecting the mask using radiation of other wavelengths and having different penetration and diffraction characteristics are avoided. Also, the present invention is capable of probing the bulk of the mask structure, as well as the absorbers 26 deposited on the mask 22, rather than probing only the surface features, as is the case in other mask inspection systems. The present invention forms an image from the actual X-ray transmissions of the mask 22, which is the quantity most relevant to the mask's performance in the X-ray lithography process.

The mask inspection system 15, and method of mask inspection just described, may also be employed in the inspection of EUV masks and EUV steppers used in EUV lithography. In EUV masks, X-ray absorber patterns 26 deposited onto X-ray transmissive materials are replaced with patterns of EUV non-reflective materials overcoated onto a multilayer EUV reflector which absorbs EUV rays impinging on the reflective mask from, in this case, an EUV source 30 (using the same reference numerals for the corresponding elements of the EUV mask system and the X-ray mask system). For device production using EUV lithography, a photoresist, which is sensitive to the EUV radiation impinging thereon, is exposed through an EUV stepper (not shown). The pattern of the reflective EUV mask 22 is thereby transferred to the photoresist, which is then developed to remove areas of the photoresist to match the mask pattern. Electronic or micromechanical structures are then formed on a substrate in the patterned area of the photoresist. Defects 28 in the EUV reflective mask will thus cause errors in the photoresist pattern, and defects in the resulting electronic or micromechanical structure.

Inspection of an EUV mask in accordance with the present invention is accomplished in essentially the same manner as the X-ray mask inspection as described above. The EUV mask is placed in its proper position in the EUV stepper. The converter layer 18 of the inspection system 15 is then placed at the wafer plane of the stepper. Alternatively, the converter 18 may be held in close proximity to the mask to directly map the light intensity. Since the mask features are relatively large (i.e., 4 or 5 times the critical dimension) a faithful image can be obtained at a distance between the converter 18 and the mask 22 of around 0.5 $\mu$m. EUV rays passing through the stepper impinge on the converter 18, which emits electrons 32 whose intensity is related to the intensity of UV rays passing through the mask 22. The electrons 32 are converted to an image of the mask pattern, which may be displayed and analyzed as described above using the computer comparison and display system 20. In the case of EUV mask inspection, defects 34 become apparent as errors in the image.

The inspection system 15 of the present invention may also be used to perform X-ray and EUV inspection of objects other than lithography masks. For example, a sample including biological or other structures may be placed in the position of the mask 22 between the X-ray or EUV source 30 and the photo-emitting cathode 16. Radiation passing through the sample may be absorbed by some portions of the sample and not by other portions of the sample. Electrons 32 will be emitted by the converter 18 in a pattern whose intensity is proportional to the local intensity of radiation impinging thereon. The electrons are then magnified by the electron microscope 17, and the resulting image may be displayed on the computer system 20. In this manner, the X-ray or EUV transmission or absorption characteristics of the sample may be observed and analyzed using the inspection system of the present invention.

It should be noted that the present invention is not limited to the particular embodiments or applications as set forth herein as illustrative, but embraces all such modified forms thereof as come within the scope of the following claims.

What is claimed is:

1. Apparatus for the inspection of an X-ray mask including an X-ray transparent substrate layer that allows X-rays to pass relatively unimpeded therethrough and X-ray absorbers positioned on the substrate layer in an absorber pattern through which X-rays are passed in a pattern, comprising:

(a) a converter positioned to receive the X-rays in the pattern passed through the X-ray mask and to convert the pattern of X-rays received to a pattern of electrons emitted from the converter with the local intensity directly proportional to the local intensity of the X-rays impinging on the converter;

(b) an electron microscope positioned to receive the electrons emitted from the converter and having electron optics therein to magnify the pattern of electrons and provide a visible display of the magnified pattern;

(c) a camera receiving the visible display and providing an output signal corresponding thereto;

(d) a computer receiving the output signal and digitizing the output signal;

(e) a display connected to the computer to display the digitized image from the computer;

(f) means for storing a digitized as desired pattern of the X-ray mask; and (g) means for comparing the as designed pattern to the digitized image.

2. The apparatus of claim 1 wherein the converter comprises a thin film phosphor deposited on a membrane to form a photo-emitting cathode.

3. The apparatus of claim 1 wherein the electron microscope comprises a photo-emission electron microscope including an electrostatic imaging column, a microchannel plate image intensifier with the electrostatic imaging column outputting an enlarged photo-emission yield picture of the pattern of electrons emitted from the converter onto the microchannel plate image intensifier, and a phosphorous screen, with the electrons being accelerated by the microchannel plate image intensifier onto the phosphorous screen to convert the photo-emission yield distribution into a visible image.

4. The apparatus of claim 1 including data memory connected to the computer for storage of the digitized image.

5. The apparatus of claim 1 including an X-ray source providing X-rays that are passed through the object.

6. The apparatus of claim 5 wherein the X-ray source is a synchrotron.

7. The apparatus of claim 1 wherein the display comprises a computer monitor.

8. A method for inspection of an X-ray lithography mask having a substrate layer and X-ray absorber material formed on the substrate in a pattern by X-rays, comprising the steps of:

(a) passing X-rays through the X-ray mask such that the X-rays are more greatly absorbed by the absorber material in the pattern than the X-rays passed through the substrate between the absorber material so that the X-rays passed through the X-ray mask define an X-ray image;

(b) directing the X-rays passed through the X-ray mask onto a converter to convert the X-ray image to a corresponding image formed by electrons emitted from the converter; and (c) magnifying the image of the emitted electrons by an electron microscope and displaying the magnified electron image.

9. The method of claim 8 wherein in the step of passing the X-rays through the object, the X-rays are provided from a synchrotron.

10. The method of claim 8 further comprising the step of digitizing the magnified electron image and storing the digitized image data.

11. The method of claim 8 wherein the X-ray lithography mask is designed to form a pattern on a photoresist layer when the X-ray mask is positioned a selected distance from the photoresist layer and X-rays are passed through the mask onto the photoresist layer, and comprising additionally the step of positioning the X-ray mask at the selected distance from the converter before passing X-rays through the mask and directing the X-rays onto the converter.

12. The method of claim 8 including the additional step of comparing the magnified electron image to an as designed lithography mask pattern.

13. A method for inspection of a lithography mask having material formed thereon for patterning radiation incident on the mask, comprising the steps of:

(a) exposing the mask to radiation to pattern the radiation;

(b) directing the patterned radiation into a converter to convert the patterned radiation to a corresponding patterned image formed by electrons emitted from the converter;

(c) magnifying the image of the emitted electrons by an electron microscope; and (d) displaying the magnified electron image.

14. The method of claim 13 wherein the lithography mask is an X-ray lithography mask having a substrate layer and an X-ray absorber material formed on the substrate in a pattern and wherein the step of exposing the mask to radiation includes passing X-rays through the X-ray lithography mask.

15. The method of claim 13 wherein the lithography mask is an extreme ultraviolet lithography mask having a pattern of ultraviolet non-reflective materials overcoated on an ultraviolet reflector and wherein the step of exposing the mask to radiation includes directing ultraviolet radiation to impinge on the mask.

16. The method of claim 13 including the additional step of comparing the magnified electron image to an as designed lithography mask pattern.

17. The method of claim 13 wherein the lithography mask is designed to form a pattern on a photoresist layer when the mask is positioned a selected distance from the photoresist layer and the photoresist layer is exposed to radiation via the mask, and comprising additionally the step of positioning the lithography mask at the selected distance from the converter before exposing the mask to radiation and directing the radiation into the converter.

\* \* \* \* \*

UNITED STATES PATENT AND TRADEMARK OFFICE
CERTIFICATE OF CORRECTION

PATENT NO. : 6,002,740
DATED : December 14, 1999
INVENTOR(S) : Franco Cerrina and Thomas B. Lucatorto It is certified that error appears in the above-identified patent and that said Letters Patent is hereby corrected as shown below:

In column 8, line 44 of the patent, delete "desired" and insert in its place --designed--

Signed and Sealed this

Fifteenth Day of May, 2001

*Attest:*

NICHOLAS P. GODICI

*Attesting Officer*     *Acting Director of the United States Patent and Trademark Office*